US012567839B2

(12) United States Patent
He et al.

(10) Patent No.: US 12,567,839 B2
(45) Date of Patent: Mar. 3, 2026

(54) FEEDFORWARD AMPLIFIER CIRCUIT, AUDIO AMPLIFIER AND AUDIO PLAYING DEVICE

(71) Applicant: GUANGZHOU TOPPING TECHNOLOGY CO., LTD., Guangdong (CN)

(72) Inventors: Yueqiu He, Guangdong (CN); Hetian Yang, Guangdong (CN)

(73) Assignee: GUANGZHOU TOPPING ELECTRONICS AND TECHNOLOGY CO., LTD., Guangdong (CN)

( * ) Notice: Subject to any disclaimer, the term of this patent is extended or adjusted under 35 U.S.C. 154(b) by 774 days.

(21) Appl. No.: 17/800,619

(22) PCT Filed: May 17, 2021

(86) PCT No.: PCT/CN2021/094208
§ 371 (c)(1),
(2) Date: Aug. 18, 2022

(87) PCT Pub. No.: WO2022/241627
PCT Pub. Date: Nov. 24, 2022

(65) Prior Publication Data
US 2024/0235493 A1 Jul. 11, 2024

(51) Int. Cl.
*H03F 1/34* (2006.01)
*H03F 1/26* (2006.01)
(Continued)

(52) U.S. Cl.
CPC ................. *H03F 1/34* (2013.01); *H03F 1/26* (2013.01); *H03F 3/187* (2013.01);
(Continued)

(58) Field of Classification Search
CPC ... H03F 1/34; H03F 1/26; H03F 3/187; H03F 3/45475; H03F 2200/03; H03F 2201/3218;
(Continued)

(56) References Cited

U.S. PATENT DOCUMENTS

| | | | |
|---|---|---|---|
| 7,106,132 B1 | 9/2006 | Kewariwal et al. | |
| 2006/0001487 A1 | 1/2006 | Petrovic et al. | |
| 2006/0158247 A1* | 7/2006 | Lee ......................... | H03F 3/217 330/10 |

FOREIGN PATENT DOCUMENTS

| | | |
|---|---|---|
| CN | 1681201 A | 10/2005 |
| CN | 101674056 A | 3/2010 |

(Continued)

OTHER PUBLICATIONS

International Search Report for International Application No. PCT/CN2021/094208 issued by the Chinese Patent Office on Feb. 15, 2022.

(Continued)

*Primary Examiner* — Andrea Lindgren Baltzell
*Assistant Examiner* — Jose E Pinero
(74) *Attorney, Agent, or Firm* — IP & T GROUP LLP

(57) ABSTRACT

Provided are feedforward amplifier circuit, audio amplifier and audio playing device, including: a main amplifier circuit, an adder circuit, a sub-amplifier circuit and a subtractor circuit, wherein the main amplifier circuit adds distortion to a first input signal to output a distorted signal, and inputs the distorted signal to the adder circuit and the subtractor circuit for performing feedforward correction; the sub-amplifier circuit amplifies a second input signal and serves as a positive input of the subtractor, so that a signal gain output by the subtractor is equal to a signal gain of the main amplifier; the subtractor circuit, with the distorted signal as a negative input, reversely amplifies the distorted signal and (Continued)

afterwards performs feedforward; and the adder circuit superimposes the distorted signal output by the main amplifier circuit and the reversely amplified distorted signal output by the subtractor, so as to output a distortion-free signal.

20 Claims, 4 Drawing Sheets

(51) Int. Cl.
 *H03F 3/187* (2006.01)
 *H03F 3/45* (2006.01)
(52) U.S. Cl.
 CPC ..... *H03F 3/45475* (2013.01); *H03F 2200/03* (2013.01); *H03F 2201/3218* (2013.01)
(58) Field of Classification Search
 CPC .. H03F 2200/135; H03F 1/3229; H03F 1/565; H03F 3/195

USPC .......................................................... 330/84
See application file for complete search history.

(56) References Cited

FOREIGN PATENT DOCUMENTS

| | | | |
|---|---|---|---|
| CN | 102291150 | A | 12/2011 |
| CN | 104768104 | A | 7/2015 |
| CN | 106330111 | A | 1/2017 |
| JP | 2020-043466 | A | 3/2020 |
| KR | 10-2008-0061537 | A | 7/2008 |

OTHER PUBLICATIONS

Written Opinion for International Application No. PCT/CN2021/094208 issued by the Chinese Patent Office on Feb. 15, 2022.
Office Action for Chinese Patent Application No. 202180011392.X issued by the Chinese Patent Office on Mar. 8, 2025.

* cited by examiner

FEEDFORWARD AMPLIFIER CIRCUIT, AUDIO AMPLIFIER AND AUDIO PLAYING DEVICE

CROSS-REFERENCE TO RELATED APPLICATION

This application is a national stage application of PCT/CN2021/094208 filed on May 17, 2021. The disclosure of the foregoing applications is incorporated herein by reference in its entirety.

TECHNICAL FIELD

The present disclosure relates to the field of feedforward amplifier circuits, and in particular, to a feedforward amplifier circuit, an audio amplifier and an audio playing device.

BACKGROUND ART

In the existing feedforward amplifier circuits, when selecting circuit component parameters, it is necessary to consider the impact on the open-loop frequency-amplitude characteristics and the feedback loop of the main amplifier, such that the determination of circuit component parameters has cumbersome process, and the selected target circuit components may be costly, and the final generated feedforward amplifier circuit is of more complex structure.

SUMMARY

The present disclosure provides a feedforward amplifier circuit, an audio amplifier and an audio playing device, wherein the circuit structure and the selection of component parameters are simplified and the costs are saved, by getting rid of the dependence on the open-loop frequency-amplitude characteristic and the feedback loop of the main amplifier.

The present disclosure provides a feedforward amplifier circuit, comprising: a main amplifier circuit, an adder circuit, a sub-amplifier circuit and a subtractor circuit, wherein the main amplifier circuit adds distortion to a first input signal to output a distorted signal, and inputs the distorted signal to the adder circuit and the subtractor circuit for performing feedforward correction; the sub-amplifier circuit amplifies a second input signal and serves as a positive input of the subtractor, so that a signal gain output by the subtractor is equal to a signal gain of the main amplifier; the subtractor circuit, with the distorted signal as a negative input, reversely amplifies the distorted signal and then performs feedforward; and the adder circuit superimposes the distorted signal output by the main amplifier circuit and the reversely amplified distorted signal output by the subtractor, so as to output a distortion-free signal.

Optionally, the main amplifier circuit comprises a main amplifier, an impedance Z1 and a first feedback impedance, and the first feedback impedance comprises an impedance r and an impedance R, wherein the first input signal enters from a positive input end of the main amplifier, an output end of the main amplifier is connected to one end of the impedance Z1, and the other end of the impedance Z1 is connected to one end of the impedance r, the other end of the impedance r is respectively connected to one end of the impedance R and a negative input end of the main amplifier, and the other end of the impedance R is grounded.

Optionally, the sub-amplifier circuit comprises a sub-amplifier and a second feedback impedance, and the second feedback impedance comprises an impedance r and an impedance R, wherein the second input signal enters from a positive input end of the sub-amplifier, an output end of the sub-amplifier is respectively connected to the subtractor and one end of the impedance r, and the other end of the impedance r is respectively connected to one end of the impedance R and a negative input end of the sub-amplifier, and the other end of the impedance R is grounded.

Optionally, the subtractor circuit comprises a subtractor and a third feedback impedance, and the third feedback impedance comprises an impedance r2 and an impedance r1, wherein a positive input end of the subtractor is connected to an output end of the sub-amplifier in the sub-amplifier circuit, and a negative input end of the subtractor is connected to one end of the impedance r1 and one end of the impedance r2, the other end of the impedance r1 is connected to the main amplifier circuit, and the other end of the impedance r2 is connected to the output end of the subtractor. Optionally, the adder circuit comprises an impedance Z1, an impedance Z2 and an impedance Z3, wherein one end of the impedance Z1 is respectively connected with an output end of the main amplifier in the main amplifier circuit and the other end of the impedance r1 in the subtractor circuit, the other end of the impedance Z1 is respectively connected with one end of the impedance Z2 and one end of an impedance r of the main amplifier, the other end of the impedance Z2 is respectively connected to the output end and one end of the impedance Z3, and the other end of the impedance Z3 is connected to an output end of the subtractor in the subtractor circuit.

Optionally, an amplification factor of a first feedback impedance of the main amplifier circuit and an amplification factor of a second feedback impedance of the sub-amplifier circuit are equal to each other or in same ratio.

Optionally, the subtractor in the subtractor circuit has an amplification factor of 1 for the distortion-free signal, while has an amplification factor of $-(r2/r1)$ for point distortion between the impedance Z1 and an output end of the main amplifier in the main amplifier circuit.

Optionally, impedance in the adder circuit satisfies following relationship: $(r2/r1)(Z1+Z2)=Z3$.

Optionally, it further comprises an input end and an output end, wherein the input end is configured to provide the input signal, and the output end outputs a distortion-free signal.

Optionally, if resistance value of the impedance Z1 is 0, then the main amplifier circuit, the sub-amplifier circuit, the subtractor circuit and the adder circuit are each discrete.

Optionally, it further comprises an amplifier equivalent circuit configured to equivalently replace the main amplifier circuit and the sub-amplifier circuit.

Optionally, the amplifier equivalent circuit comprises an amplifier, an impedance r1, an impedance r2 and an impedance r3.

Optionally, a positive input end of the amplifier receives a first input signal, and a negative input end of the amplifier is respectively connected to one ends of the impedance r1, the impedance r2 and the impedance r3, the other end of the impedance r1 receives a second input signal, the other end of the impedance r2 is connected to the output end of the amplifier, and the other end of the impedance r3 is grounded.

The present disclosure also provides an audio amplifier, comprising the feedforward amplifier circuit mentioned above.

The present disclosure also provides an audio playing device, comprising the audio amplifier mentioned above, further comprising a processing chip and a playing component connected to the audio amplifier.

The feedforward amplifier circuit, audio amplifier and audio playing device provided by the present disclosure have the following beneficial effects.

The main amplifier and the sub-amplifier have the inputs which are consistent. The output signal of the sub-amplifier and the negative input signal output from the main amplifier are output after passing through the subtractor, and then synthesized with the output of the main amplifier through the adder circuit, to obtain the total output signal, which has small dependence on the negative feedback of the main amplifier. In addition, the equivalent impedance is located inside and outside the feedback loop of the main amplifier. The negative input end of the subtractor receives a signal (sampling) between the impedance within the loop and the output of the main amplifier, and the impedance connected to the output end of the subtractor and the impedance outside the loop form an adding circuit. The ratio of the equivalent impedances inside and outside the feedback loop of the main amplifier is equal to the reverse amplification factor of the subtractor. When the output of the subtractor is the same as the level of the distortion-free signal of the general output terminal, the impedance Z3 has no voltage difference of the distortion-free signal, that is, no distortion-free current flows through the impedance Z3, that is, the output end of the subtractor does not output a distortion-free current, so that the subtractor does not shunt. In addition, the impedances of the adder, the sub-amplifier and the subtractor may be resistors, so as to achieve the effect of suppressing the distortion and not shunting a large amount of current in the sub-circuit. Compared with the prior art, the beneficial effects of the audio amplifier and the audio playing device provided by the present disclosure are the same as those of the above-mentioned feedforward amplifier circuit relative to the prior art, which will not be repeated here.

BRIEF DESCRIPTION OF DRAWINGS

In order to describe the technical solutions of the present disclosure more clearly, the drawings, needed therein, will be briefly introduced below. It should be understood that the following drawings only show some embodiments of the present disclosure, and therefore should not be regarded as a limitation on the scope. For those skilled in the art, other related drawings can also be obtained according to these drawings without any creative efforts.

REFERENCE NUMBERS

Figure 1:
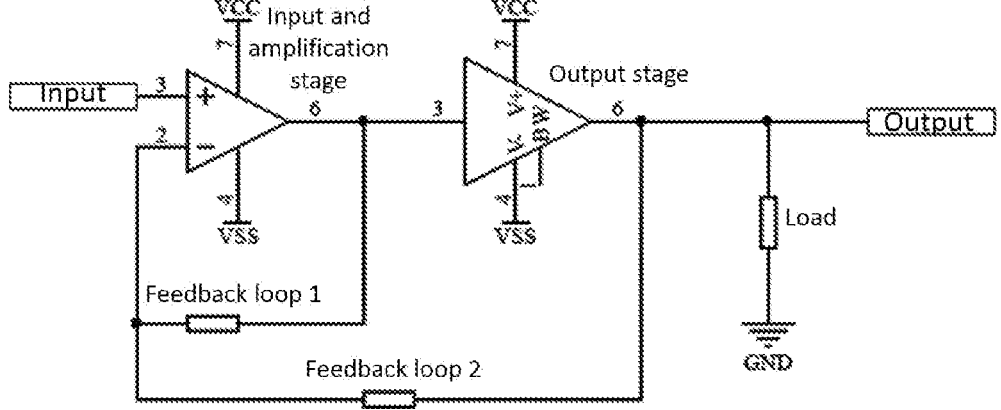
FIG. 1 is a diagram of the circuit structure of a conventional feedforwardless audio amplifier.

1—first circuit structure; 2—second circuit structure.

DETAILED DESCRIPTION OF EMBODIMENTS

In order to make the objectives, technical solutions and advantages of the present disclosure clearer, the technical solutions in the present disclosure will be described clearly and completely below with reference to the drawings in the present disclosure. Obviously, the described embodiments are some, but not all, of the embodiments of the present disclosure. Generally, the components of the present disclosure described and illustrated in the drawings herein may be arranged and designed in a variety of different configurations.

The terms "first", "second", etc. are only used to describe the distinguishing, and should not be construed to indicate or imply the importance of relativity. The terms, "include", "comprise" or any other variation thereof are intended to encompass non-exclusive inclusion, such that a process, method, article or device comprising a list of elements comprises not only those elements, but also other elements not expressly listed, or also comprises elements inherent to such a process, method, article or device. Without further limitation, an element qualified by the phrase "comprising a" does not preclude the presence of additional identical elements in a process, method, article or device that comprises the element.

It should also be noted that, unless otherwise expressly specified and limited, the terms, such as "arrangement" and "connection" should be understood in a broad sense, for example, "connection" may be a fixed connection, a detachable connection, or an integral connection; it can be a mechanical connection or an electrical connection; it can be a direct connection or an indirect connection through an intermediate medium, and it can be the internal communication of two components. For those skilled in the art, the specific meanings of the above terms in the present disclosure can be understood according to specific situations.

The specific embodiments of the present disclosure will be described in detail below with reference to the drawings.

FIG. 1 shows the common structure of audio amplifiers without feedforward. Most of the distortion of the output stage can be eliminated by the negative feedback of a large loop. For low-power amplifiers, the feedback amount of an operational amplifier with good performance can reduce the distortion below 1 kHz to a very low level, which can meet the application requirements. However, as the frequency increases, its open-loop multiple decreases rapidly, and therefore, the feedback amount decreases rapidly and the distortion will increase. For high-power amplifiers, the output stage will produce huge distortion when the output stage has output of large power in Class B or Class A and B state, so that the low-frequency distortion cannot be reduced to a low level. Therefore, the application effect of such feedforwardless audio amplifier is unsatisfying.

Figure 2:
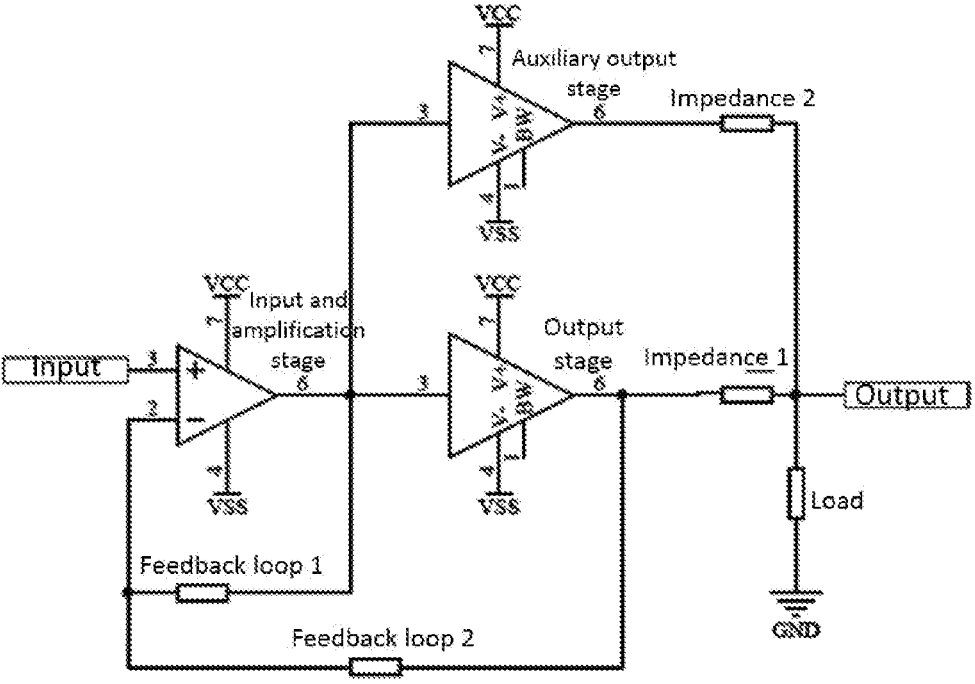
FIG. 2 is a diagram of the circuit structure of a conventional feedforward amplifier.

In FIG. 2, a feedforward circuit is added on the basis of the amplifier shown in FIG. 1 above, and also impedance 1, impedance 2 and an auxiliary output stage are added. This structure was first applied in the 1970s and 1980s. The feedforward circuit structure can provide more distortion suppression amount. Because the distortion suppression effect does not decrease along with the increase of frequency, it is mainly used to make up for the attenuation of the distortion suppression amount caused by the attenuation of the negative feedback amount at high frequencies. Herein, the auxiliary output stage can be omitted or can be an independent amplifier.

The principle of the distortion suppression is as follows. The distortion at the output point of the output stage passes through the feedback loop (feedback loop 1 and feedback loop 2), the input and amplification stage to become a signal whose phase and amplitude are related to the aforementioned path, and is output by the auxiliary output stage, and then after the output signals of the two output stages pass through the adder circuit formed by the impedance 1 and the impedance 2 selected according to the aforementioned path, a signal with suppressed distortion can be obtained at the output point, and ideally, the distortion can be completely eliminated.

According to the above-mentioned existing feedforward principle, due to the dependence on the open-loop frequency-amplitude characteristics and the feedback loop of the main amplifier, the following shortcomings will occur in practice.

1. Because the impedance 1 and impedance 2 of the adder circuit are directly related to the parameters of the path from the feedback point to the output point of the input and output stage, the frequency-amplitude characteristic curve of the path should be as straight or regular as possible to facilitate selection of the impedance 1 and impedance 2. Assuming that the input and amplifier stage is an operational amplifier with a very large open-loop multiple, in order to obtain a relatively straight frequency-amplitude characteristic line, the feedback loop can be a resistor and a Miller capacitor. When the selected value is appropriate, the frequency-amplitude characteristic is the ratio of the capacitance impedance to the resistance. Because the impedance 1 is directly connected to the output stage, it has to withstand a very large current and cannot have large distortion. Therefore, basically only the resistance and the inductance may be selected. If it is selected that the impedance 1 is the resistance, it is best that the impedance 2 is pure capacitance, and however this requires the auxiliary output stage to have a good capacitive load capacity, which makes the structure of the auxiliary output stage more complicated. Alternatively, it is selected that the impedance 2 is formed by a small resistance and capacitance in series with each other, which will affect the matching of the adder circuit and the path, and compensation is needed in the feedback path. If it is selected that the impedance 1 is the inductance, it should be selected that the impedance 2 is the resistance, and however the inductance must have parasitic resistance that cannot be ignored in this case, which requires that the impedance 2 and a capacitor are in series, so as to correspond to the parasitic resistance. Moreover, the commonly used inductor is pure copper, and the parasitic resistance has a large temperature coefficient. It is not practical to select a capacitor with a corresponding temperature coefficient to perform compensation, because the inductor generates heat and the capacitor is heated, and the temperature change is difficult to be predicted. Moreover, the capacitor should be a high-performance capacitor which does not have such a large temperature coefficient, the inductor needs to be connected with a resistor that is larger than the resistance value of the parasitic resistance by an order of magnitude, to reduce the influence of the temperature drift of the parasitic resistance. It can be seen that even if the input and output stages are operational amplifiers with very large open-loop multiples that are close to the ideal situation, there are still many problems in the choice of impedance; and in reality, the large error of the impedance, especially capacitance and inductance, directly limits the strength of distortion suppression.

2. In the above case, the input and amplifier stage is an ideal operational amplifier, wherein when this stage uses a discrete circuit designed for itself, the frequency-amplitude characteristic line is likely to be curved. To obtain a straighter frequency-amplitude characteristic line, the Miller capacitance must be sufficiently large, which will sacrifice a large amount of feedback, which is not worth the loss. In the above case of using a Miller capacitor for performing single-pole compensation, if it is desired to obtain more feedback amount, it is needed to use double-pole compensation. In order to correspond to the curved frequency-amplitude characteristic line generated by double-pole compensation, the adder circuit will be more complicated.

3. According to the principle, the distortion of the output point of the output stage will be amplified by a large multiple. If the distortion is large, such as clipping, even a slight clipping will cause the feedforward to be unable to work properly. If the amplification factor of the designed path is very small, for example, the Miller capacitor is replaced by a resistor that is not too large, the larger distortion can also be corrected, and a relatively flat frequency-amplitude characteristic line in the audio range can be obtained, so that the adder circuit only needs two resistors to suppress the distortion, but this sacrifices a huge amount of feedback, which is not worth the loss.

4. The auxiliary output stage also provides current to the load. The shunt ratio is the impedance ratio, which is the amplification factor of the above path. When the load is very large and the current is very large, the output current of the auxiliary output stage is the distorted current plus the shunt current, and therefore there are certain requirements for current output capacity and scale.

5. Existing methods rely heavily on the negative feedback, and therefore the requirement for the amount of feedback is relatively high.

6. In the existing method, it needs to be able to take a point from the front of the output stage, which cannot be applied to an overall amplifier chip, if no input and amplifier stage with the amplifier chip wrapped in a feedback loop is added.

Based on this, the present disclosure provides a feedforward amplifier circuit, an audio amplifier and an audio playing device, which can simplify the circuit structure and selection of component parameters and save costs, by getting rid of the dependence on the open-loop frequency-amplitude characteristic and feedback loop of the main amplifier.

Figure 3:
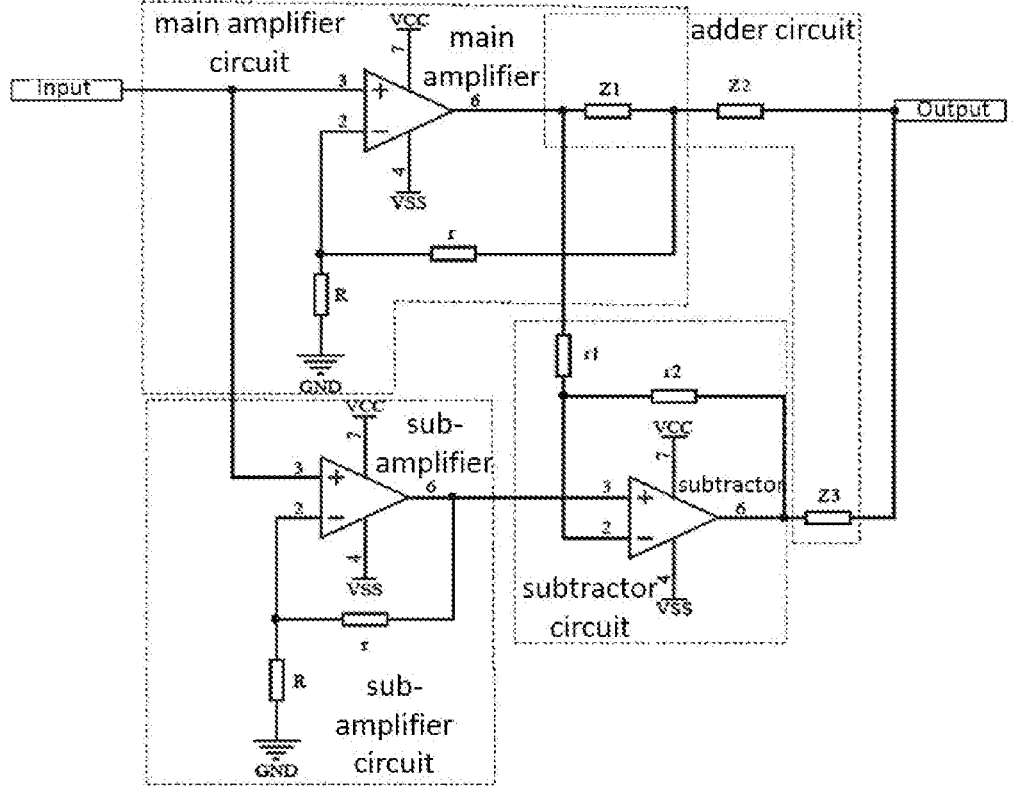
FIG. 3 is diagram of the circuit structure of a feedforward amplifier provided by the present disclosure.

Referring to FIG. 3, the present disclosure provides a feedforward amplifier circuit, the components of which comprise: a main amplifier circuit, an adder circuit, a sub-amplifier circuit and a subtractor circuit. It should be noted that the impedance in the present disclosure is not limited to a resistance and can be suitable inductors, capacitors, resistors, or combinations thereof. In the present disclosure, it is assumed that the impedances in the circuit structure are all resistors, and the open-loop amplification factor of the amplifier is very large, which is for the purpose of description. Exemplarily, if all the impedances can be resistors, the cost is low, the precision is high, the stability is high, and many values can be selected.

The main amplifier circuit adds distortion to the first input signal to output a distorted signal, and inputs the distorted signal to the adder circuit and the subtractor circuit for performing feedforward correction. The sub-amplifier circuit amplifies the second input signal and serves as the positive input of the subtractor circuit, so that the signal gain output by the subtractor is equal to the signal gain of the main amplifier. The subtractor circuit takes the distorted signal as a negative input, reversely amplifies the distorted signal, and then performs feedforward. The adder circuit superimposes the distorted signal output by the main amplifier circuit and the reverse-amplified distorted signal output by the subtractor, to output a distortion-free signal. In practical applications, optionally, the main amplifier circuit outputs a distorted signal and then feeds forward, and at the same time, the distorted signal and the signal obtained by the sub-amplifier circuit amplifying and gaining the input signal are jointly input into the subtractor circuit, and the subtractor makes the distorted signal reversely amplified and performs feedforward. The distorted signal fed forward by the main amplifier is superimposed with the signal obtained by being reversely amplified by the subtractor and fed forward, and a signal in an undistorted state is output. Optionally, the distortion-free signal may include the first input signal, the second input signal, or the first input signal and the second input signal. The present disclosure adopts an independent feedforward circuit to amplify the signal and distortion, and the dependence on the main amplifier circuit is greatly reduced. A straight and regular frequency-amplitude characteristic line is not required, so as for facilitating matching of device parameters in the adder circuit. The main amplifier does not need to sacrifice too much feedback amount, and can even use double-pole compensation to further increase the feedback amount to improve performance. In addition, it is not necessary to take a point between the output stage and the amplification stage of main amplifier to lead out to connect to the adder, which makes the circuit more flexible and applicable to a wider range.

Due to the signal gain effect of the sub-amplifier, the signal gain of the main amplifier is the same as that of the subtractor. Here, there is a distorted voltage difference between the output of the main amplifier circuit and the output of the subtractor circuit. The sub-amplifier circuit in the present disclosure can cause that no signal voltage difference is between the output of the main amplifier circuit and the output of the subtractor circuit, that is, there is no signal voltage difference between both ends of the impedance Z3. If there is a voltage difference between the two, it will make the sub-amplifier circuit also become a load.

On the basis of the foregoing embodiment, the gain of the sub-amplifier can also be higher or lower than the gain of the output of the main amplifier, and in the following circuit, it is attenuated or amplified to the gain of the output of the main amplifier.

Optionally, in this embodiment, it further comprises an input end and an output end, wherein the input end is configured to provide an input signal, and the output end outputs a distortion-free signal.

Here, the main amplifier circuit comprises a main amplifier, an impedance Z1, and a first feedback impedance, wherein the first feedback impedance comprises an impedance r and an impedance R; the first input signal enters from the positive input end of the main amplifier, and the output end of the main amplifier is connected with one end of the impedance Z1, the other end of the impedance Z1 is connected to one end of the impedance r, the other end of the impedance r is connected to one end of the impedance R and the negative input end of the main amplifier, respectively, and the other end of the impedance R is grounded. It can be understood that the main amplifier circuit comprises the first feedback impedance, composed of an impedance r and an impedance R, and the impedance r and the impedance R constitute a voltage division circuit.

The open-loop of the main amplifier can have a low open-loop amplification factor. At this time, the value of the impedance needs to be changed correspondingly to realize that the subtractor does not shunt.

Exemplarily, the sub-amplifier circuit comprises a sub-amplifier and a second feedback impedance, and the second feedback impedance comprises an impedance r and an impedance R; the second input signal enters from the positive input end of the sub-amplifier, and the output end of the sub-amplifier is connected to the subtractor and one end of the impedance, respectively. The other end of the impedance r is connected to one end of the impedance R and the negative input end of the sub-amplifier, respectively, and the other end of the impedance R is grounded.

Optionally, the subtractor circuit comprises a subtractor and a third feedback impedance, and the third feedback impedance comprises impedance r2 and impedance r1; the positive input end of the subtractor is connected to the output end of the sub-amplifier in the sub-amplifier circuit, and the negative input end of the subtractor is connected with one end of the impedance r1 and one end of the impedance r2, the other end of the impedance r1 is connected to the main amplifier circuit, and the other end of the impedance r2 is connected to the output end of the subtractor.

Here, the subtractor only outputs or absorbs the distorted current theoretically, and does not need to provide current to the load, so that requirement on its current output capability is lower. When the open-loop multiple of the main amplifier is very large and the impedance Z2 is greater than the impedance Z1, the distorted current is approximately equal to the distorted voltage at the output end of the main amplifier without feedforward as shown in FIG. 1 being divided by Z2. Because the subtractor does not need shunt, the reverse amplification factor and Z3 do not need to be set as large values, so that even if the distortion of the main amplifier circuit is relatively large, it can still feed forward normally after amplification. When the main amplifier has minor clipping, the distortion suppression is still possible.

Optionally, the adder circuit comprises impedance Z1, impedance Z2 and impedance Z3; one end of impedance Z1 is respectively connected with the output end of the main amplifier in the main amplifier circuit and the other end of the impedance r1 in the subtractor circuit, and the other end of the impedance Z1 is connected to one end of impedance Z2 and one end of the impedance r of the main amplifier, respectively, the other end of impedance Z2 is connected to the output end and one end of impedance Z3, respectively, and the other end of impedance Z3 is connected to the output end of the subtractor in the subtractor circuit.

Optionally, the amplification factors of the first feedback impedance of the main amplifier circuit and the second feedback impedance of the sub-amplifier circuit are the same or in the same ratio, wherein the main amplifier can also be reversed amplification, and correspondingly, the sub-amplifier should be changed to the reversed amplification.

Exemplarily, the subtractor in the subtractor circuit has an amplification factor of 1 for the distortion-free signal, and the amplification factor of $-(r2/r1)$ for the point distortion between the impedance Z1 and the output end of the main amplifier in the main amplifier circuit. The impedances Z1~Z3 in the adder circuit satisfy the following relationship: $(r2/r1)\times(Z1+Z2)=Z3$. In addition, the impedance in the adder circuit can also comprise the following relationship: $Z2/Z1=r2/r1$, where the impedance Z1 and the impedance Z2 generally are set as the smaller impedance values, because they have to bear a large current.

Herein, when only $(r2/r1)\times(Z1+Z2)=Z3$ is satisfied, but $Z2/Z1=r2/r1$ is not satisfied, there is still a very good distortion correction effect, but the auxiliary output stage will participate in the shunt.

In the present disclosure, since the dependence on the feedback of the main amplifier is greatly reduced, the impedance does not need to be valued strictly according to the properties of the main amplifier. For the main amplifier with a large open-loop amplification factor, it is only necessary to know its closed-loop amplification factor. The reverse amplification factor of the subtractor can be set by itself, and the value of the adder circuit is also in the simple relationship described above.

When the impedance satisfies the above relationship and it is assumed that both the sub-amplifier and the subtractor have no distortion to the input signal, after the distorted signal at the output end of the main amplifier is reversely amplified by the subtractor and the adder performs the positive and negative cancellation, the output point has no distortion. It is also assume that the output current of the main amplifier is I, the input is u, and the distortion-free signal at the negative feedback point is U, then the voltage drop of Z1 is I×Z1, and the voltage drop of Z2 is I×Z2, that is, I×(r2/r1)×Z1, so that the output signal is (U−I×(r2/r1)× Z1). The voltage drop of Z1 is amplified reversely by (r2/r1) times by the subtractor, so that the output distortion-free signal of the subtractor is (U−I×(r2/r1)×Z1), which is the same as that at the output point, so that the subtractor does not output the current of the distortion-free signal or does not carry a load.

Optionally, if the resistance value of the impedance Z1 is 0, the main amplifier circuit, the sub-amplifier circuit, the subtractor circuit and the adder circuit are each discrete, and the point of the subtractor is actually outside the main amplifier loop, and there is no dependency on the negative feedback of the main amplifier.

When Z1 is 0 and (r2/r1) Z2=Z3, there is still a very good distortion correction effect and it does not rely on the negative feedback of the main amplifier at all, so that the output stage can be separately subjected to the distortion correction and then added with a negative feedback loop.

Figure 4:
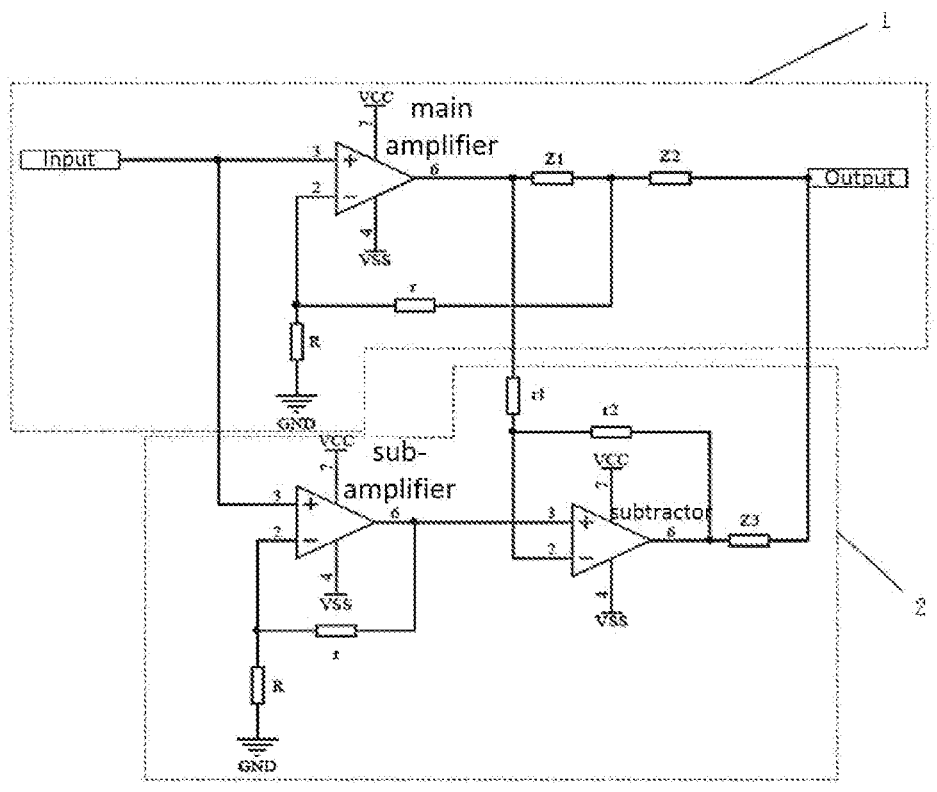
FIG. 4 is a schematic diagram of a circuit structure of a feedforward amplifier provided by the present disclosure.

In the present disclosure, as shown in FIG. 4, the feedforward amplifier circuit can be divided into two parts, including a first circuit structure 1 and a second circuit structure 2.

Figure 5:
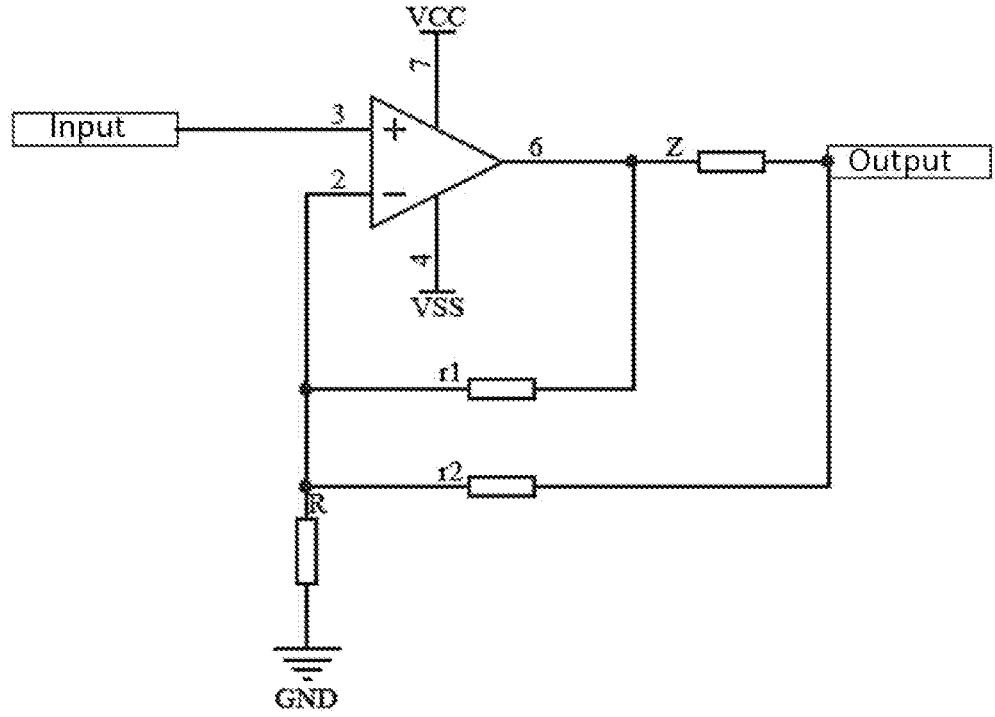
FIG. 5 is diagram of the circuit structure of an equivalent replacement circuit provided by the present disclosure.

Optionally, the first circuit structure 1 can be equivalently replaced with the circuit structure shown in FIG. 5. At this time, the impedance is of the following relationship, (r1/(r1+r2))×Z=Z1, (r2/(r1+r2))×Z=Z2, r=r1/r2, where r1//r2 represents the value of the impedance r1 and the impedance r2 in parallel.

Figure 6:
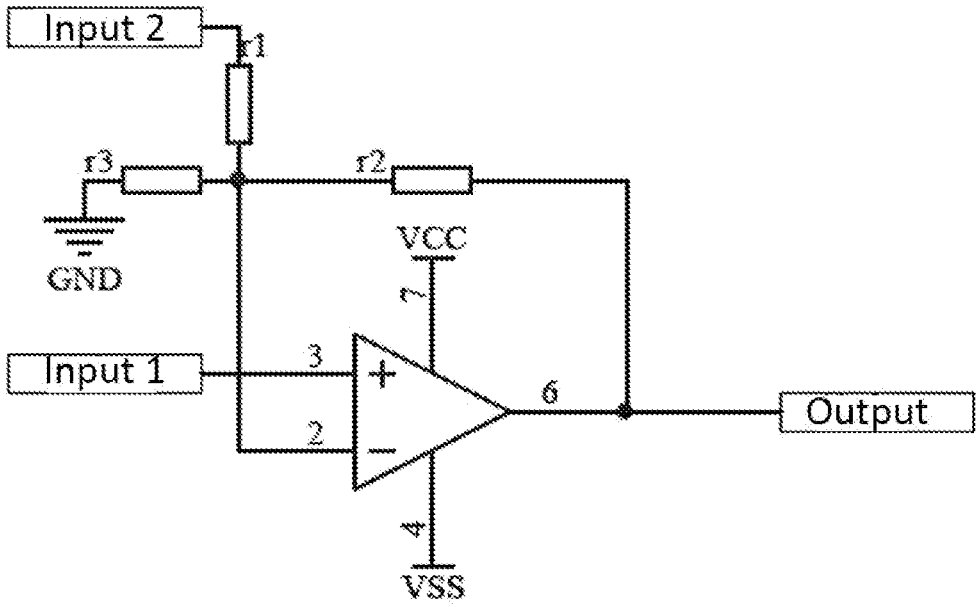
FIG. 6 is diagram of the circuit structure of another equivalent replacement circuit provided by the present disclosure.

Optionally, the second circuit structure 2 can also be replaced with the amplifier equivalent circuit shown in FIG. 6. Herein, the amplifier equivalent circuit is configured to equivalently replace the main amplifier circuit and the sub-amplifier circuit. The amplifier equivalent circuit comprises an amplifier, impedance r1, impedance r2, and impedance r3. The positive input end of the amplifier receives the first input signal, the negative input end of the amplifier is respectively connected to one ends of the impedance r1, the impedance r2 and the impedance r3, the other end of the impedance r1 receives the second input signal, and the other end of the impedance r2 is connected to the output end of the amplifier, and the other end of the impedance r3 is grounded. At this time, the impedance in the sub-amplifier is of the following relationship, r=r2, R=r1//r3.

Optionally, the sub-amplifier or subtractor can also achieve corresponding equivalent substitution effects in an equivalent parallel manner.

Optionally, both the main amplifier and the sub-amplifier can use inverting input or differential input.

The present disclosure also provides an audio amplifier, including the above-mentioned feedforward amplifier circuit, which is applied in the technical field of audio amplification, solving the same technical problems and achieves the same technical effects as the foregoing feedforward amplifier circuit, which will not be repeated here.

The present disclosure also provides an audio playing device, including the audio amplifier as described above, and a processing chip and a playing component connected to the audio amplifier. The processing chip sends a control signal, and after the controlled audio signal passes through the audio amplifier, it is output without distortion, and then played through the playing component to realize the distortion-free effect of audio playing.

Finally, it should be noted that the above-mentioned embodiments are only specific implementations of the present disclosure, and used to illustrate the technical solutions of the present disclosure rather than limit them. The protection scope of the present disclosure is not limited thereto. Although the present disclosure is described in detail by referring to the foregoing embodiments, those skilled in the art should understand that: any person skilled in the art who is familiar with the technical field of the present disclosure can still carry out modifications or easily conceive of changes to the technical solutions described in the foregoing embodiments within the technical scope disclosed by the present disclosure, or make equivalent replacements to some of the technical features therein. These modifications, changes or replacements do not make the essence of the corresponding technical solutions deviate from the spirit and scope of the technical solutions of the embodiments of the present disclosure, and should be covered by the protection scope of the present disclosure. Therefore, the protection scope of the present disclosure should be based on the protection scope of the claims.

INDUSTRIAL APPLICABILITY

The feedforward amplifier circuit of the present disclosure comprises a main amplifier circuit, an adder circuit, a sub-amplifier circuit and a subtractor circuit. The inputs of the main amplifier and the sub-amplifier are consistent with each other, and the output signal of the sub-amplifier and the negative input signal output from the main amplifier are output after passing through the subtractor, and then pass through the adder circuit and was synthesized with output of the main amplifier to obtain the total output signal, and the dependence on the negative feedback of the main amplifier is small.

What is claimed is:

1. A feedforward amplifier circuit, comprising: a main amplifier circuit, an adder circuit, a sub-amplifier circuit and a subtractor circuit, wherein
   the main amplifier circuit adds distortion to a first input signal to output a distorted signal, and inputs the distorted signal to the adder circuit and the subtractor circuit for performing feedforward correction;
   the sub-amplifier circuit amplifies a second input signal and serves as a positive input of the subtractor circuit, so that a signal gain output by a subtractor in the subtractor circuit is equal to a signal gain of a main amplifier in the main amplifier circuit;
   the subtractor circuit, with the distorted signal as a negative input, reversely amplifies the distorted signal and then performs feedforward; and
   the adder circuit superimposes the distorted signal output by the main amplifier circuit and a reversely amplified distorted signal output by the subtractor, so as to output a distortion-free signal;
   wherein the first input signal and the second input signal are consistent.

2. The feedforward amplifier circuit according to claim 1, wherein the main amplifier circuit comprises the main amplifier, an impedance Z1 and a first feedback impedance, and the first feedback impedance comprises an impedance r and an impedance R, wherein the first input signal enters from a positive input end of the main amplifier, wherein an output end of the main amplifier is connected to one end of the impedance Z1, and the other end of the impedance Z1 is connected to one end of the impedance r, the other end of the impedance r is respectively connected to one end of the impedance R and a negative input end of the main amplifier, and the other end of the impedance R is grounded.

3. The feedforward amplifier circuit according to claim 1, wherein the sub-amplifier circuit comprises a sub-amplifier and a second feedback impedance, and the second feedback impedance comprises an impedance r and an impedance R, wherein the second input signal enters from a positive input end of the sub-amplifier, an output end of the sub-amplifier is respectively connected to the subtractor and one end of the impedance r, and the other end of the impedance r is respectively connected to one end of the impedance R and a negative input end of the sub-amplifier, and the other end of the impedance R is grounded.

4. The feedforward amplifier circuit according to claim 1, wherein the subtractor circuit comprises a subtractor and a third feedback impedance, and the third feedback impedance comprises an impedance r2 and an impedance r1, wherein a positive input end of the subtractor is connected to an output end of the sub-amplifier in the sub-amplifier circuit, and a negative input end of the subtractor is connected to one end of the impedance r1 and one end of the impedance r2, the other end of the impedance r1 is connected to the main amplifier circuit, and the other end of the impedance r2 is connected to an output end of the subtractor.

5. The feedforward amplifier circuit according to claim 1, wherein the adder circuit comprises an impedance Z1, an impedance Z2 and an impedance Z3, wherein one end of the impedance Z1 is respectively connected with an output end of the main amplifier in the main amplifier circuit and the other end of the impedance r1 in the subtractor circuit, the other end of the impedance Z1 is respectively connected with one end of the impedance Z2 and one end of an impedance r of the main amplifier, the other end of the impedance Z2 is respectively connected to an output end and one end of the impedance Z3, and the other end of the impedance Z3 is connected to an output end of the subtractor in the subtractor circuit.

6. The feedforward amplifier circuit according to claim 1, wherein an amplification factor of a first feedback impedance of the main amplifier circuit and an amplification factor of a second feedback impedance of the sub-amplifier circuit are equal to each other or in same ratio.

7. The feedforward amplifier circuit according to claim 4, wherein the subtractor in the subtractor circuit has an amplification factor of 1 for the distortion-free signal, while has an amplification factor of $-(r2/r1)$ for point distortion between impedance Z1 and an output end of the main amplifier in the main amplifier circuit.

8. The feedforward amplifier circuit according to claim 1, wherein the adder circuit satisfies following relationship:

$$(r2/r1) \times (Z1 + Z2) = Z3.$$

9. The feedforward amplifier circuit according to claim 1, further comprising an input end and an output end, wherein the input end is configured to provide the input signal, and the output end outputs the distortion-free signal.

10. The feedforward amplifier circuit according to claim 1, wherein if a resistance value of an impedance Z1 is 0, then the main amplifier circuit, the sub-amplifier circuit, the subtractor circuit and the adder circuit are each discrete.

11. The feedforward amplifier circuit according to claim 1, further comprising an amplifier equivalent circuit, configured to equivalently replace the main amplifier circuit and the sub-amplifier circuit.

12. The feedforward amplifier circuit according to claim 11, wherein the amplifier equivalent circuit comprises an amplifier, an impedance r1, an impedance r2 and an impedance r3.

13. The feedforward amplifier circuit according to claim 12, wherein a positive input end of the amplifier receives a first input signal, and a negative input end of the amplifier is respectively connected to one ends of the impedance r1, the impedance r2 and the impedance r3, the other end of the impedance r1 receives a second input signal, the other end of the impedance r2 is connected to an output end of the amplifier, and the other end of the impedance r3 is grounded.

14. An audio amplifier, comprising the feedforward amplifier circuit according to claim 1.

15. An audio playing device, comprising the audio amplifier according to claim 14, further comprising a processing chip and a playing component connected to the audio amplifier.

16. The feedforward amplifier circuit according to claim 2, wherein the sub-amplifier circuit comprises a sub-amplifier and a second feedback impedance, and the second feedback impedance comprises an impedance r4 and an impedance R4, wherein the second input signal enters from a positive input end of the sub-amplifier, an output end of the sub-amplifier is respectively connected to the subtractor and one end of the impedance r4, and the other end of the impedance r4 is respectively connected to one end of the impedance R4 and a negative input end of the sub-amplifier, and the other end of the impedance R4 is grounded.

17. The feedforward amplifier circuit according to claim 2, wherein the subtractor circuit comprises a subtractor and a third feedback impedance, and the third feedback impedance comprises an impedance r2 and an impedance r1, wherein a positive input end of the subtractor is connected to an output end of the sub-amplifier in the sub-amplifier circuit, and a negative input end of the subtractor is connected to one end of the impedance r1 and one end of the impedance r2, the other end of the impedance r1 is connected to the main amplifier circuit, and the other end of the impedance r2 is connected to an output end of the subtractor.

18. The feedforward amplifier circuit according to claim 2, wherein the adder circuit comprises an impedance Z1, an impedance Z2 and an impedance Z3, wherein one end of the impedance Z1 is respectively connected with an output end of the main amplifier in the main amplifier circuit and the other end of the impedance r1 in the subtractor circuit, the other end of the impedance Z1 is respectively connected with one end of the impedance Z2 and one end of an impedance r of the main amplifier, the other end of the impedance Z2 is respectively connected to an output end and one end of the impedance Z3, and the other end of the impedance Z3 is connected to an output end of the subtractor in the subtractor circuit.

19. The feedforward amplifier circuit according to claim 2, wherein an amplification factor of a first feedback impedance of the main amplifier circuit and an amplification factor of a second feedback impedance of the sub-amplifier circuit are equal to each other or in same ratio.

20. The feedforward amplifier circuit according to claim 4, wherein the adder circuit satisfies following relationship:

$$\left(r2/r1\right) \times (Z1 + Z2) = Z3.$$

\* \* \* \* \*